(12) United States Patent
Karnezos

(10) Patent No.: US 7,728,417 B2
(45) Date of Patent: Jun. 1, 2010

(54) INTEGRATED CIRCUIT PACKAGE SYSTEM INCLUDING SHIELD

(75) Inventor: Marcos Karnezos, Palo Alto, CA (US)

(73) Assignee: STATS ChipPAC Ltd., Singapore (SG)

( * ) Notice: Subject to any disclaimer, the term of this patent is extended or adjusted under 35 U.S.C. 154(b) by 477 days.

(21) Appl. No.: 11/419,748

(22) Filed: May 22, 2006

(65) Prior Publication Data

US 2007/0108582 A1 May 17, 2007

Related U.S. Application Data

(60) Provisional application No. 60/595,013, filed on May 27, 2005.

(51) Int. Cl.
*H01L 23/02* (2006.01)
(52) U.S. Cl. ............... 257/678; 257/659; 257/708; 257/728; 257/730; 257/732; 257/E23.114; 361/816; 438/121
(58) Field of Classification Search ............ 257/708, 257/730, 732, 659, 728, E23.114, 678; 438/121; 361/816
See application file for complete search history.

(56) References Cited

U.S. PATENT DOCUMENTS

| | | | | | |
|---|---|---|---|---|---|
| 4,339,628 | A | * | 7/1982 | Marcantonio et al. | 174/372 |
| 5,354,951 | A | * | 10/1994 | Lange et al. | 174/372 |
| 5,763,824 | A | | 6/1998 | King et al. | |
| 6,628,524 | B1 | * | 9/2003 | Washino et al. | 361/737 |
| 6,757,181 | B1 | | 6/2004 | Villanueva et al. | |
| 6,777,819 | B2 | * | 8/2004 | Huang | 257/796 |
| 2004/0077329 | A1 | * | 4/2004 | Asano et al. | 455/325 |
| 2004/0084198 | A1 | * | 5/2004 | Seidler | 174/35 R |
| 2004/0124518 | A1 | * | 7/2004 | Karnezos | 257/686 |

* cited by examiner

*Primary Examiner*—Eugene Lee
*Assistant Examiner*—Peniel M Gumedzoe
(74) *Attorney, Agent, or Firm*—Mikio Ishimaru

(57) ABSTRACT

A method of manufacture of an integrated circuit package system which includes providing a substrate and attaching a first device to the substrate. Attaching a shield to the substrate. Processing the shield to form apertures and configuring the shield to block electromagnetic energy that passes through the apertures.

10 Claims, 4 Drawing Sheets

INTEGRATED CIRCUIT PACKAGE SYSTEM INCLUDING SHIELD

CROSS-REFERENCE TO RELATED APPLICATION(S)

This application claims the benefit of U.S. Provisional Patent Application Ser. No. 60/595,013 filed May 27, 2005.

TECHNICAL FIELD

The present invention relates generally to integrated circuit package systems, and more particularly to integrated circuit package systems including shields.

BACKGROUND ART

It is now possible to put on a single piece of semiconductor, millions of devices running at clock frequency values expressed in hundreds of megahertz or even gigahertz for some electronic components. These devices, such as resistors, capacitors, transistors, and integrated circuits are what power many of today's consumer electronics, such as cellphones, video cameras, portable music players, computers, etc. Unfortunately, many of these devices emit or are susceptible to undesirable energy disturbances, such as electromagnetic (EM) and radio frequency (RF) interference. For example, a device that emits electromagnetic or radio frequency signals may adversely impact neighboring electronic components and devices. Consequently, the electronics industry has sought solutions for shielding these electronic components and devices from emitting or receiving disruptive energy signals.

Several methods are available for protecting and shielding one or more electronic components from EM and RF interference. One method of protecting an electronic component from emitting such emissions is to provide a shield, which serves to shield an area of the printed circuit board(s), or a volume associated therewith. The shield functions by either containing EM energy, e.g., radiated RF signals, within a shielded volume or area or the electromagnetic energy is excluded by the shield structure from the shielded volume or area.

Such shielding is extensively used in television receivers, direct satellite broadcast receivers, radio receivers such as FM and short-wave, or portions of audio systems, wherein low signal level circuitry is amenable to being effected by stray electromagnetic fields emanating from alternating current (AC) power sources.

A printed circuit board (PCB) is a common electronic substrate to which a shield can be applied since PCBs enjoy widespread use in a number of electronic applications. The term "printed circuit board" generally refers to circuit boards having electrical conductors disposed on one or more side of a substrate (e.g., a dielectric substrate). Often a PCB will have openings or via formed through the substrate to receive electrical leads of an electronic component that is mounted on one side of the PCB. The electrical leads extend through the openings to contact pads disposed on the other side of the PCB. The leads are typically soldered to the contact pads.

There are several techniques for mounting the shield to the PCB. One technique is to directly solder the shield to a ground plane of a PCB that is proximate to EM and RF emitting components. Another technique involves the use of shield clips coupled to the ground plane of a PCB to which a shield is permanently attached. Another technique involves the use of removable shields attached to shield clips coupled to the ground plane of the PCB.

For the most part, the shields totally encompass the semiconductor components and this presents a problem when both the semiconductor components and the shields are to be embedded in an encapsulant to form a protective package system. In order to have free entry of the encapsulant, however, there must be openings in the shields, but openings in the shields provide escape paths for EM and RF interference.

Thus, a need still remains for an integrated circuit package system that prevents transmission of disruptive electromagnetic energy, but yet still allows for easy encapsulation of a semiconductor component located within a shield. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system, which includes providing a substrate and attaching a first device to the substrate. Attaching a shield to the substrate. Processing the shield to form apertures and configuring the shield to block electromagnetic radiation that passes through the apertures.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
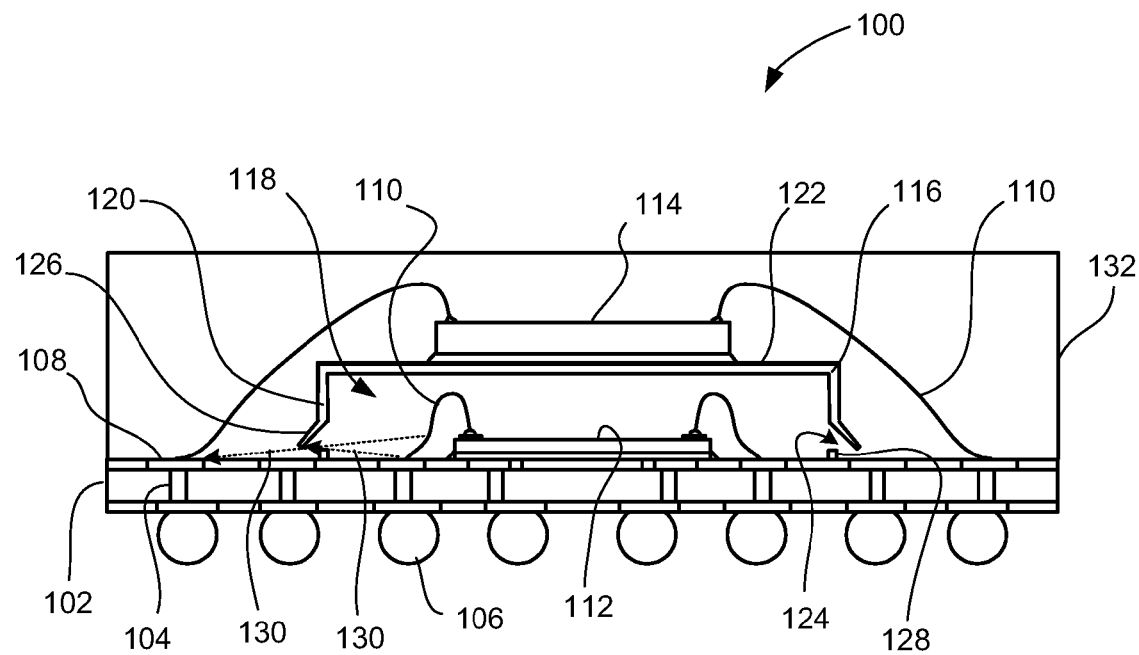
FIG. 1 is a cross-sectional view of an integrated circuit package system including a shield in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of a substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The terms "processed" and "processing" as used herein includes deposition of material or photoresist, patterning, exposure, development, etching, cutting, cleaning, and/or removal of the material or photoresist as required in forming a described structure.

Generally, the present invention relates to an integrated circuit package system employing a shield, such as an electromagnetic interference shield or a radio frequency interference shield. The present invention enables the injection of an encapsulation material through the shield by forming apertures that facilitate direct encapsulation of one or more semiconductor devices located within the shield. By protecting the one or more semiconductor devices located within the shield with an encapsulation material, the reliability of the device can be improved. For example, the encapsulation material can prevent moisture from attacking and oxidizing the bond pads located within the shield's protected environment; the encapsulation material can provide a uniform dielectric environment; and the encapsulation material can help to securely fasten the shield to the substrate, while providing additional structural support to the shield by eliminating void space between the shield and the substrate.

Notably, the shield and its apertures of the present invention not only facilitate the dispersion of an encapsulation material over the semiconductor devices located within the shield, but they also prevent the transmission of disruptive electromagnetic energy. The shield and its apertures are configured in such a manner so as to block or absorb any disruptive electromagnetic energy, which can detrimentally affect susceptible electronic components. For purposes of this invention, electromagnetic energy includes all energy within the electromagnetic spectrum, such as radio frequency energy.

Referring now to FIG. 1, therein is shown a cross-sectional view of an integrated circuit package system 100 including a shield 116 in accordance with an embodiment of the present invention. The integrated circuit package system 100 includes a substrate 102, via 104, terminals 106, contact pads 108, wire bonds 110, a first device 112, a second device 114, the shield 116, avoid space 118, sidewalls 120, atop 122, aperture(s) 124, a projection 126, a lower sidewall 128, a radiation energy 130, and an encapsulation material 132.

The substrate 102 may include a body of material on or in which circuit elements are fabricated, such as a printed circuit board. The via 104 interconnect the terminals 106 to the contact pads 108 for transmitting electrical signals to and from the integrated circuit package system 100. Although the present embodiment depicts the terminals 106 as solder balls, it is to be understood that the terminals 106 may include any interface connection technology, such as pins, that establishes electrical contact between the integrated circuit package system 100 and external electrical circuits. As an exemplary illustration, the external electrical circuits may include additional printed circuit boards or semiconductor packages.

The wire bonds 110 transmit the electrical signals between the contact pads 108 and the first device 112 and the second device 114. The first device 112 and the second device 114 may include semiconductor chips and integrated circuit packages selected from active components, passive components, surface mount components, stacked components, and so forth, in numerous configurations and arrangements as may be needed.

By way of example and not by way of limitation, the first device 112 and the second device 114 may more specifically include integrated circuit packages that transmit and/or receive electromagnetic energy, such as leaded and non-leaded packages, single and dual-side memory packages, internal stacking module packages, flip-chip packages, modular packages, application-specific-integrated-circuit (ASIC) packages, stacked die packages or a combination thereof. Furthermore, the first device 112 and the second device 114 may further include, by way of example and not by way of limitation, semiconductor chips that transmit and/or receive electromagnetic energy, such as flip-chip die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. As an exemplary illustration, the first device 112 and the second device 114 may include PiP and PoP configurations. Additionally, by way of example, the integrated circuit package system 100, itself, may include a PiP configuration or a PoP configuration.

However, it is to be understood that the first device 112 and the second device 114 of the present invention cover a wide range of package and die configurations, and the type of package or die configuration employed is only limited by the design specifications of the integrated circuit package system 100.

As an exemplary illustration, the first device 112 can be a radio frequency die and the second device 114 can be a base-band die capable of transmitting and receiving the frequency band occupied by the modulated signals.

Notably, the present invention allows for testing of the first device 112 and the second device 114 before adhering them to the integrated circuit package system 100, therefore ensuring the use of known good die or packages in the manufacturing process. Additionally, after adhering the first device 112 and the second device 114 to the integrated circuit package system 100, these assemblies can also be tested before incorporation into additional package systems. This ensures that the final product includes known good assemblies, and thereby improves the manufacturing process yield for packaging.

Additionally, although the present invention depicts the formation of a fillet extending past the perimeter of the first device 112 and the second device 114, it is to be understood that either or both of the first device 112 and the second device 114 can be attached employing zero-fillet technology. The use of zero-fillet technology can help to reduce the footprint of the first device 112, and consequently, help to reduce the overall footprint of the integrated circuit package system 100. As an exemplary illustration, by employing zero-fillet technology the distance between the first device 112 and the shield 116 can be reduced below five-hundred (500) micrometers.

The shield 116 encloses a void space 118 that includes the first device 112. The shield 116 may either contain or exclude electromagnetic energy from a volume or area, such as the void space 118. The shield 116 can be affixed to the substrate 102 by solder or low impedance electrically conductive adhesive, such as a metal filled epoxy. The shield 116 is electrically connected to a ground source to dissipate any absorbed electromagnetic energy.

The shield 116 can be made from a continuous metallic material, such as copper, copper alloys, aluminum or steel; or from a continuous plastic material coated by a surface metallization, such as copper, copper alloys, aluminum or steel. The shield 116 can be formed (or punched) from a flat piece of this continuous metallic material. For purposes of this invention, continuous means unbroken (i.e. —without any openings or holes). However, it is to be understood that the composition of the shield 116 is not to be limited to the before-mentioned materials. In accordance with the scope of the present invention, the shield 116 composition may include any material that absorbs and dissipates electromagnetic energy.

The shield 116 design may include the sidewalls 120, of equal or unequal length, and the top 122. The shield 116 can be shaped in such a manner as to form the void space 118, which the first device 112 can be recessed within. Per this embodiment, the shield 116 can be square or rectangular in shape, although the scope of the present invention includes the shield 116 designed of any shape to meet the requirements of the integrated circuit package system 100.

Once adhered to the substrate 102, the shield 116 is processed to form the apertures 124. By way of example, the apertures 124 can be formed by cutting the shield 116 along a plane that is parallel to the top surface of the substrate 102. Each of the sidewalls 120 of the shield 116 can be processed to form either one of the apertures 124 or it can be processed to form more than one of the apertures 124. The number of the apertures 124 formed is only to be limited by structural integrity requirements for the shield 116, the ability to block or absorb disruptive electromagnetic energy, and the required ease desired for dispensing the encapsulation material 132 over the first device 112.

Furthermore, although the present embodiment depicts two of the sidewalls 120 of the shield 116 processed to form the apertures 124, it is to be understood that one or more of the sidewalls 120 of the shield 116 can be processed to form the apertures 124. Consequently, the invention includes processing any number of the sidewalls 120 of the shield 116 that does not adversely affect the requirements of the shield 116 for the integrated circuit package system 100.

Additionally, it is important to note that the apertures 124 can be formed anywhere along the sidewalls 120 of the shield 116 between the top surface of the substrate 102 and the top 122. The only limiting factor determining location of the apertures 124 along the sidewalls 120 is the ability of the shield 116 to block or absorb disruptive electromagnetic energy.

In general, the shield 116 and the apertures 124 are configured in a manner that best blocks or absorbs disruptive electromagnetic energy and facilitates the dispersion of the encapsulation material 132 over the first device 112, which is located within the void space 118 of the shield 116. By way of example, the shield 116 and the apertures 124 are configured to block or absorb disruptive electromagnetic energy by folding outward and lengthening a projection 126, of the shield 116, past the protruding height of the lower sidewall 128 that emanates from the substrate 102. By overlapping the projection 126 past the lower sidewall 128 height, as measured from the substrate 102 top surface, the radiation energy 130 that passes through the apertures 124 is blocked or absorbed by the shield 116, or more specifically, the projection 126. By way of example, the projection 126 can be lengthened by stamping techniques. The lower sidewall 128 is the remaining portion of the shield 116 attached to the substrate 102 after processing the shield 116 to from the apertures 124.

Additionally, the size of the apertures 124 is a factor in blocking or absorbing the radiation energy 130. The size of the apertures 124 can be determined by the distance between the tip of the projection 126 and the top of the lower sidewall 128. As an exemplary illustration, this distance should not exceed one (1) millimeter to prevent transmission of electromagnetic energy into free space or it can be determined heuristically. More specifically, the distance between the tip of the projection 126 and the top of the lower sidewall 128 can be down to fifty (50) microns to allow the encapsulation material 132 with a filler material to flow through the apertures 124. If just the encapsulation material 132 is used without a filler, the apertures 124 need only be large enough to allow flow of the encapsulation material 132.

Figure 2:
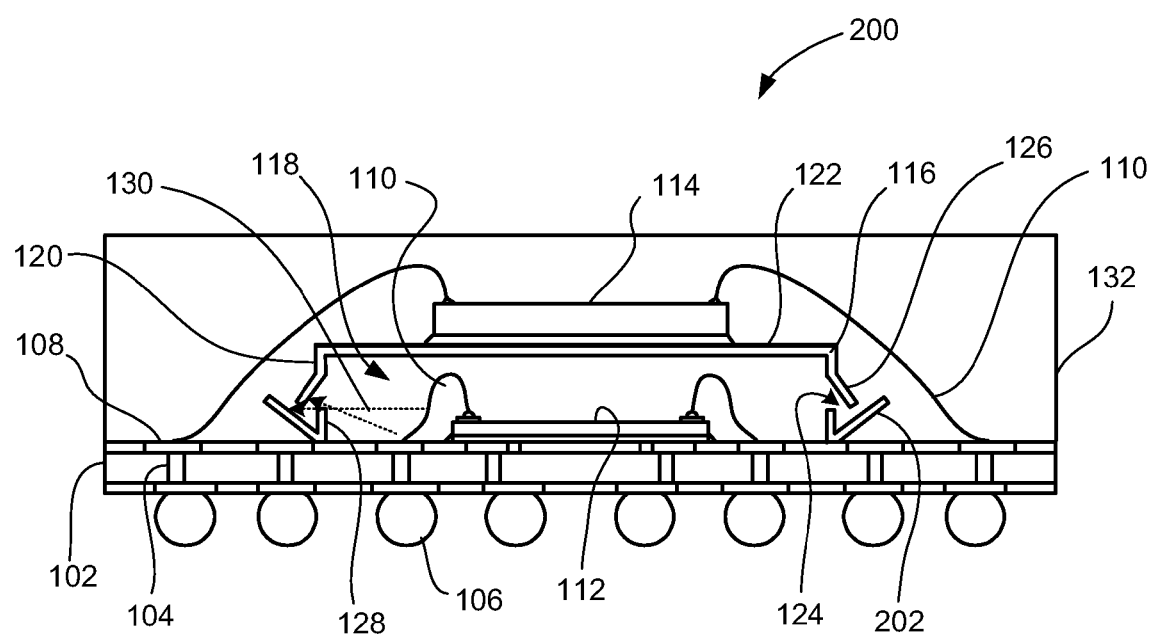
FIG. 2 is a cross-sectional view of an integrated circuit package system including a shield in accordance with another embodiment of the present invention.
Figure 3:
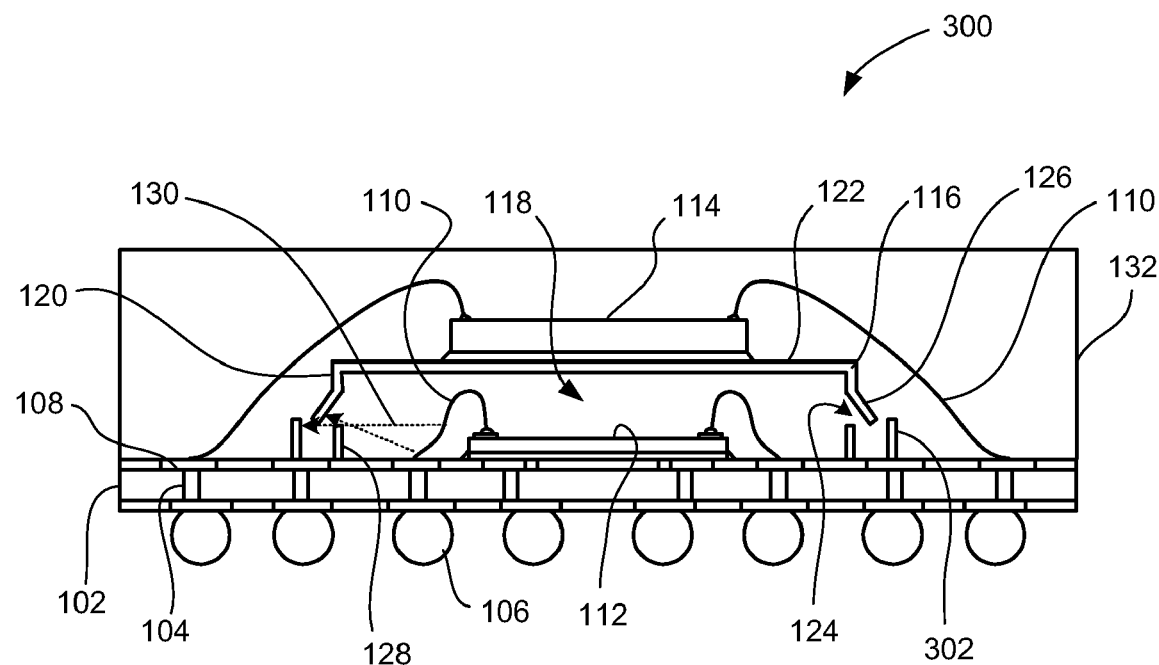
FIG. 3 is a cross-sectional view of an integrated circuit package system including a shield in accordance with another embodiment of the present invention.

Referring now to FIGS. 2 and 3. FIGS. 2 and 3 depict similar configurations as to that shown in FIG. 1, and consequently, only the differences between the figures will be described, to avoid redundancy.

Referring now to FIG. 2, therein is shown a cross-sectional view of an integrated circuit package system 200 including the shield 116 in accordance with another embodiment of the present invention. The integrated circuit package system 200 includes the substrate 102, the via 104, the terminals 106, the contact pads 108, the wire bonds 110, the first device 112, the second device 114, the shield 116, the void space 118, the sidewalls 120, the top 122, the aperture(s) 124, the projection 126, the lower sidewall 128, the radiation energy 130, the encapsulation material 132, and flange(s) 202.

Per this embodiment, the shield 116 is attached to the substrate 102 and encloses the void space 118, which contains the first device 112. The shield 116 includes the flanges 202, which are bent upward away from the top surface of the substrate 102. For example, the flanges 202 can be formed by punching upward bottom portions of the sidewalls 120 of the shield 116. Alternatively, the flange 202 can be formed by soldering a metallic element, similar to that used by the shield 116, to the lower sidewall 128 at an angle appropriate to block the radiation energy 130. The angle of incidence between the flange 202 and the top surface of the substrate (i.e. —the amount the flange 202 is bent upward) is determined by its ability to absorb or block the radiation energy 130 while facilitating dispersion of the encapsulation material 132.

The shield 116 is processed to form the apertures 124 along one or more of the sidewalls 120. The projection 126 can be bent outward and lengthened to overlap with the lower sidewall 128 or the projection 126 can just be bent outwards. The present embodiment renders the lengthening of the projection 126 optional because the flanges 202 absorb or block the radiation energy 130 that passes through the apertures 124.

The size of the apertures 124 can be determined by the distance between the tip of the projection 126 and the top of the lower sidewall 128. As an exemplary illustration, this distance should not exceed one (1) millimeter to prevent transmission of electromagnetic energy into free space or it can be determined heuristically. More specifically, the distance between the tip of the projection 126 and the top of the lower sidewall 128 can be down to fifty (50) microns to allow the encapsulation material 132 with a filler material to flow through the apertures 124. If just the encapsulation material 132 is used without a filler, the apertures 124 need only be large enough to allow flow of the encapsulation material 132. Additionally, the distance between the tip of the projection 126 and the flanges 202 should not decrease so much as to impede the flow of the encapsulation material 132.

Referring now to FIG. 3, therein is shown a cross-sectional view of an integrated circuit package system 300 including the shield 116 in accordance with another embodiment of the present invention. The integrated circuit package system 300 includes the substrate 102, the via 104, the terminals 106, the contact pads 108, the wire bonds 110, the first device 112, the second device 114, the shield 116, the void space 118, the sidewalls 120, the top 122, the aperture(s) 124, the projection 126, the lower sidewall 128, the radiation energy 130, the encapsulation material 132, and an collar shield 302.

After processing the shield 116 to form the apertures 124, the projection 126 can be bent outward and lengthened to overlap with the lower sidewall 128 or the projection 126 can just be bent outwards. The present embodiment renders the lengthening of the projection 126 optional because the collar shield 302 can absorb or block the radiation energy 130 that passes through the apertures 124. The collar shield 302 may be separately attached to the substrate 102 and may include materials similar to those used for the shield 116. The collar shield 302 should be configured to block or absorb the radiation energy 130 that passes through the apertures 124.

The height of the collar shield 302, as measured from the top surface of the substrate 102, is determined by its ability to absorb or block the radiation energy 130 while facilitating dispersion of the encapsulation material 132. Additionally, the placement of the collar shield 302 from the lower sidewall 128 is also determined by its ability to absorb or block the radiation energy 130 while facilitating dispersion of the encapsulation material 132. The collar shield 302 is also electrically connected to a ground potential.

The size of the apertures 124 can be determined by the distance between the tip of the projection 126 and the top of the lower sidewall 128. As an exemplary illustration, this distance should not exceed one (1) millimeter to prevent transmission of electromagnetic energy into free space or it can be determined heuristically. More specifically, the distance between the tip of the projection 126 and the top of the lower sidewall 128 can be down to fifty (50) microns to allow the encapsulation material 132 with a filler material to flow through the apertures 124. If just the encapsulation material 132 is used without a filler, the apertures 124 need only be large enough to allow flow of the encapsulation material 132. Additionally, the distance between the tip of the projection 126 and the collar shield 302 should not decrease so much as to impede the flow of the encapsulation material 132.

Figure 4:
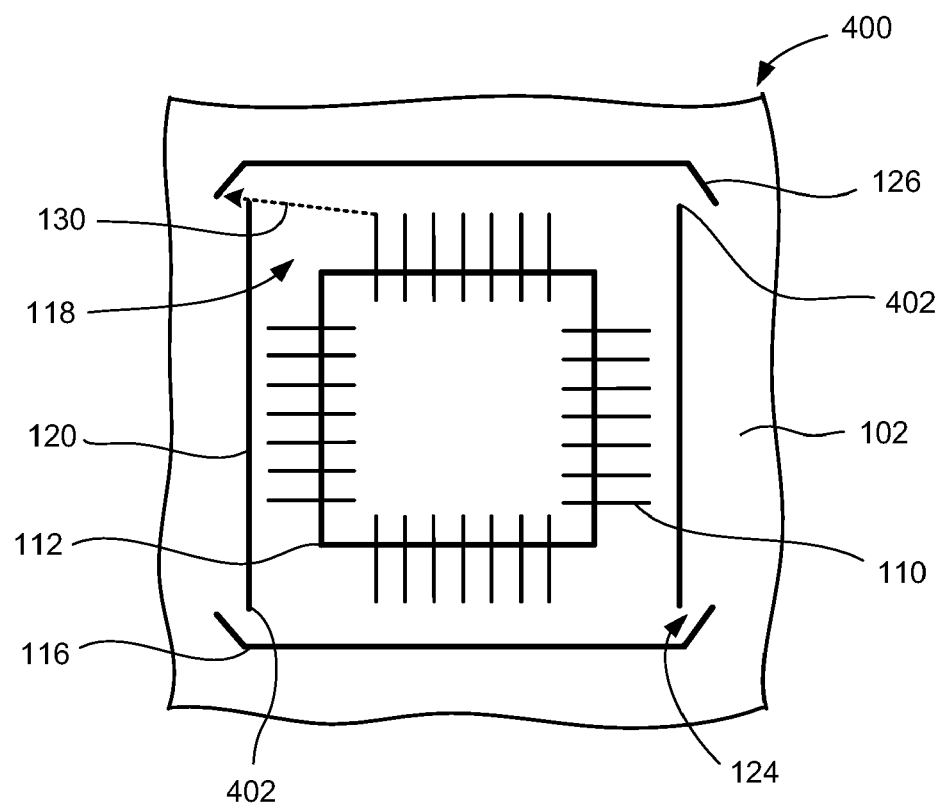
FIG. 4 is a top cross-sectional view of an integrated circuit package system including a shield in accordance with another embodiment of the present invention.

Referring now to FIG. 4, therein is shown a top cross-sectional view of an integrated circuit package system 400 including the shield 116 in accordance with another embodiment of the present invention. For purposes of illustration the encapsulation material 132, as shown in FIGS. 1 through 3, the second device 114, as shown in FIGS. 1 through 3, and the top 122, as shown in FIGS. 1 through 3, have been removed to more clearly depict the invention. The integrated circuit package system 400 includes the substrate 102, the wire bonds 110, the first device 112, the shield 116, the void space 118, the sidewalls 120, the aperture(s) 124, the projection 126, the radiation energy 130, and a sidewall end(s) 402.

The substrate 102 may include a body of material on or in which circuit elements are fabricated, such as a printed circuit board. The substrate 102 acts as an interface between the first device 112 and the second device 114, and external electrical circuits, such as additional printed circuit boards or semiconductor packages.

The wire bonds 110 transmit electrical signals between the substrate 102 and the first device 112 and the second device 114. The first device 112 and the second device 114 may include semiconductor chips and integrated circuit packages selected from active components, passive components, surface mount components, stacked components, and so forth, in numerous configurations and arrangements as may be needed.

By way of example and not by way of limitation, the first device 112 and the second device 114 may more specifically include integrated circuit packages that transmit and/or receive electromagnetic energy, such as leaded and non-leaded packages, single and dual-side memory packages, internal stacking module packages, flip-chip packages, modular packages, application-specific-integrated-circuit (ASIC) packages, stacked die packages or a combination thereof. Furthermore, the first device 112 and the second device 114 may further include, by way of example and not by way of limitation, semiconductor chips that transmit and/or receive electromagnetic energy, such as flip-chip die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. As an exemplary illustration, the first device 112 and the second device 114 may include PiP and PoP configurations. Additionally, by way of example, the integrated circuit package system 400, itself, may include a PiP configuration or a PoP configuration.

However, it is to be understood that the first device 112 and the second device 114 of the present invention cover a wide range of package and die configurations, and the type of package or die configuration employed is only limited by the design specifications of the integrated circuit package system 400.

As an exemplary illustration, the first device 112 can be a radio frequency die and the second device 114 can be a base-band die capable of transmitting and receiving the frequency band occupied by the modulated signals.

Notably, the present invention allows for testing of the first device 112 and the second device 114 before adhering them to the integrated circuit package system 400, therefore ensuring the use of known good die or packages in the manufacturing process. Additionally, after adhering the first device 112 and the second device 114 to the integrated circuit package system 400, these assemblies can also be tested before incorporation into additional package systems. This ensures that the final product includes known good assemblies, and thereby improves the manufacturing process yield for packaging.

Additionally, it is to be understood that either or both of the first device 112 and the second device 114 can be attached employing zero-fillet technology. The use of zero-fillet technology can help to reduce the footprint of the first device 112, and consequently, help to reduce the overall footprint of the integrated circuit package system 400. As an exemplary illustration, by employing zero-fillet technology the distance between the first device 112 and the shield 116 can be reduced below five-hundred (500) micrometers.

The shield 116 encloses a void space 118 that includes the first device 112. The shield 116 may either contain or exclude electromagnetic energy from a volume or area, such as the void space 118. The shield 116 is affixed to the substrate 102 by using solder or low impedance electrically conductive adhesive, such as a metal filled epoxy. The shield 116 is electrically connected to a ground source to dissipate any absorbed electromagnetic energy.

The shield 116 can be made from a continuous metallic material, such as copper, copper alloys, aluminum or steel; or from a continuous plastic material coated by a surface metallization, such as copper, copper alloys, aluminum or steel. For purposes of this invention, continuous means unbroken (i.e. —without any openings or holes). The shield 116 can be formed (or punched) from a flat piece of this continuous metallic material. However, it is to be understood that the composition of the shield 116 is not to be limited to the before-mentioned materials. In accordance with the scope of the present invention, the shield 116 composition may include any material that absorbs and dissipates electromagnetic energy.

The shield 116 design may include the sidewalls 120, of equal or unequal length, and the top 122. The shield 116 can be shaped in such a manner as to form the void space 118, which the first device 112 can be recessed within. Per this embodiment, the shield 116 can be square or rectangular in shape, although the scope of the present invention includes the shield 116 designed of any shape to meet the requirements of the integrated circuit package system 400.

Once adhered to the substrate 102, the shield 116 is processed to form the apertures 124. By way of example, the apertures 124 can be formed by cutting the shield 116 along a plane that is perpendicular to the top surface of the substrate 102. Each of the sidewalls 120 of the shield 116 can be processed to form either one of the apertures 124 or it can be processed to form more than one of the apertures 124. The number of the apertures 124 formed is only to be limited by structural integrity requirements for the shield 116, the ability to block or absorb disruptive electromagnetic energy, and the required ease desired for dispensing the encapsulation material 132 over the first device 112.

Furthermore, although the present embodiment depicts two of the sidewalls 120 of the shield 116 processed to form the apertures 124, it is to be understood that one or more of the sidewalls 120 of the shield 116 can be processed to form the apertures 124. Consequently, the invention includes processing any number of the sidewalls 120 of the shield 116 that does not adversely affect the requirements of the shield 116 for the integrated circuit package system 400.

Additionally, it is important to note that the apertures 124 can be formed anywhere along the sidewalls 120 of the shield 116. The only limiting factor determining location of the apertures 124 along the sidewalls 120 is the shield 116 ability to block or absorb disruptive electromagnetic energy.

In general, the shield 116 and the apertures 124 are configured in a manner that best blocks or absorbs disruptive electromagnetic energy and facilitates the dispersion of the encapsulation material 132 over the first device 112, which is located within the void space 118 of the shield 116. By way of example, the shield 116 and the apertures 124 are configured to block or absorb disruptive electromagnetic energy by folding and lengthening a projection 126, of the shield 116, past the sidewall end 402 adjacent to the projection 126. By overlapping the projection 126 past the sidewall end 402 adjacent to the projection 126, the radiation energy 130 that passes through the apertures 124 is blocked or absorbed by the shield 116, or more specifically, the projection 126. By way of example, the projection 126 can be lengthened by stamping techniques.

Additionally, the size of the apertures 124 is a factor in blocking or absorbing the radiation energy 130. The size of the apertures 124 can be determined by the distance between the tip of the projection 126 and the sidewall end 402. As an exemplary illustration, this distance should not exceed one (1) millimeter to prevent transmission of electromagnetic energy into free space or it can be determined heuristically. More specifically, the distance between the tip of the projection 126 and the sidewall end 402 can be down to fifty (50) microns to allow the encapsulation material 132 with a filler material to flow through the apertures 124. If just the encapsulation material 132 is used without a filler, the apertures 124 need only be large enough to allow flow of the encapsulation material 132.

Figure 5:
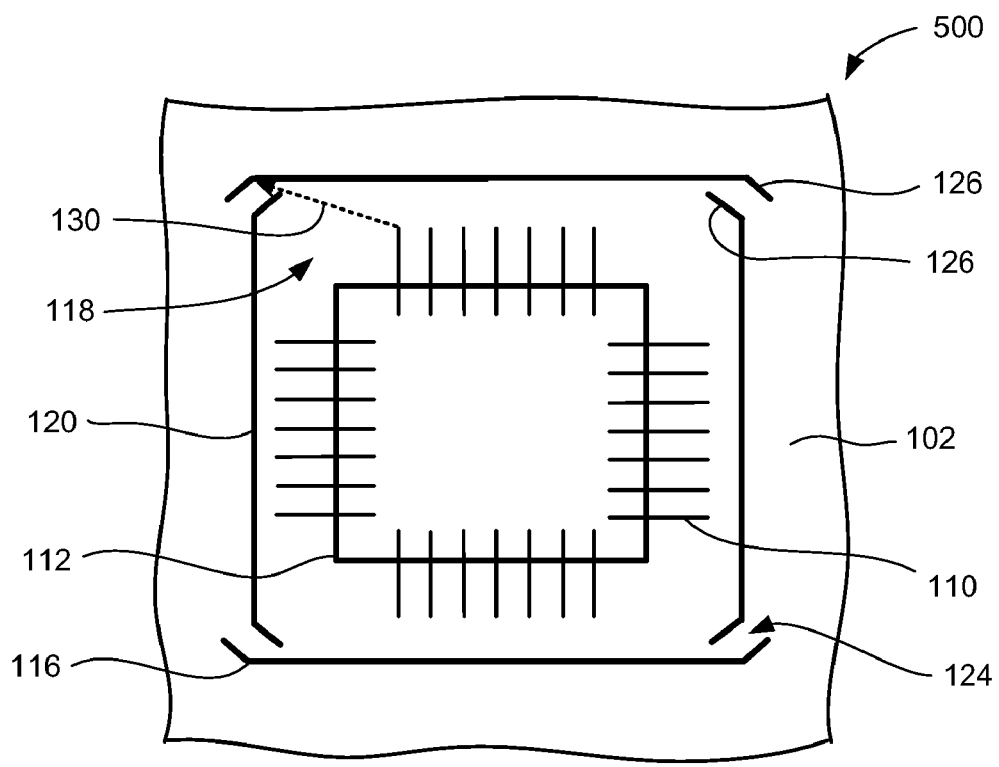
FIG. 5 is a top cross-sectional view of an integrated circuit package system including a shield in accordance with another embodiment of the present invention.
Figure 6:
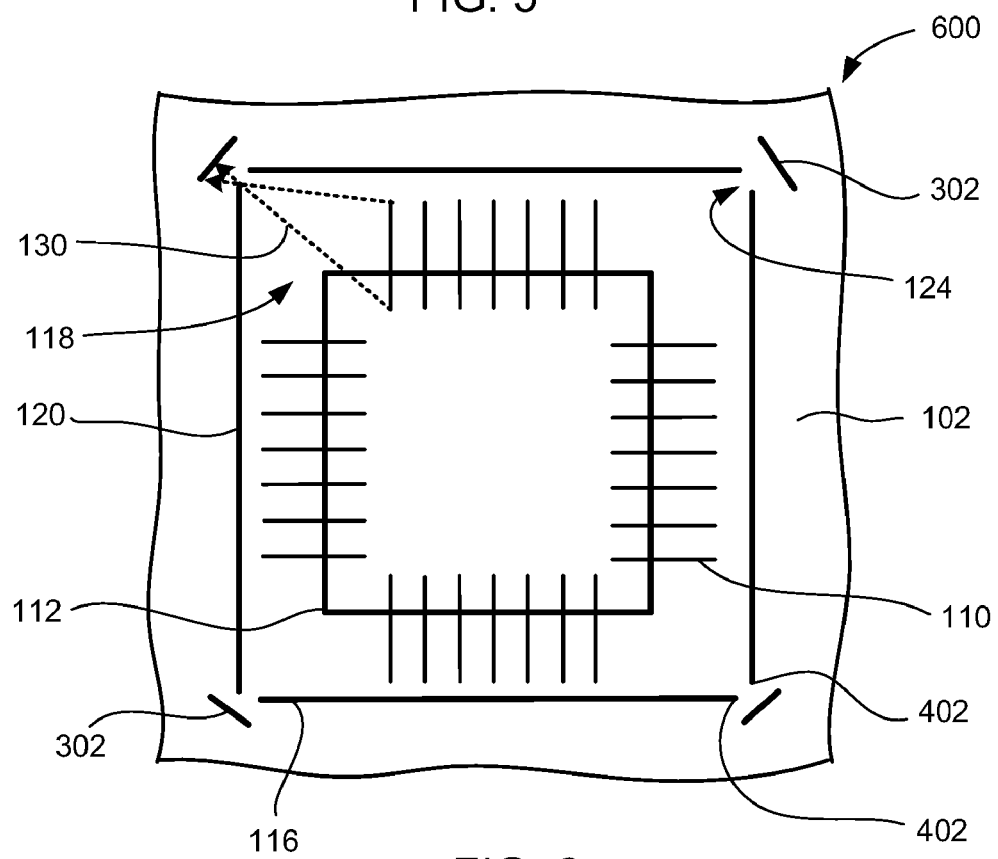
FIG. 6 is a top cross-sectional view of an integrated circuit package system including a shield in accordance with another embodiment of the present invention.

Referring now to FIGS. 5 and 6. FIGS. 5 and 6 depict similar configurations as to that shown in FIG. 4, and consequently, only the differences between the figures will be described, to avoid redundancy.

FIG. 5 shows a top cross-sectional view of an integrated circuit package system 500 including the shield 116 in accordance with another embodiment of the present invention. The integrated circuit package system 500 includes the substrate 102, the wire bonds 110, the first device 112, the shield 116, the void space 118, the sidewalls 120, the aperture(s) 124, the projection 126, and the radiation energy 130.

After processing the shield 116 to form the apertures 124, the projection 126 of one of the sidewalls 120 can be bent outwards and the projection 126 of another of the sidewalls 120 can be bent inwards. By bending one of the projections 126 outwards and by bending another of the projections 126 inwards, an overlapping configuration can be created, which prevents transmission of electromagnetic energy into free space. Additionally, one or each of the projections 126 can be lengthened by techniques, such as stamping, to prevent transmission of electromagnetic energy into free space.

As with the previous embodiments, the shield 116 is configured to facilitate the dispersion of an encapsulating material over the first device 112. The size of the apertures 124 can be determined by the distance between the tip of the projection 126 and the sidewalls 120. As an exemplary illustration, this distance should not exceed one (1) millimeter to prevent transmission of electromagnetic energy into free space or it can be determined heuristically. More specifically, the distance between the tip of the projection 126 and the sidewalls 120 can be down to fifty (50) microns to allow the encapsulation material 132 with a filler material to flow through the apertures 124. If just the encapsulation material 132 is used without a filler, the apertures 124 need only be large enough to allow flow of the encapsulation material 132.

Referring now to FIG. 6 therein is shown a top cross-sectional view of an integrated circuit package system 600 including the shield 116 in accordance with another embodiment of the present invention. The integrated circuit package system 600 includes the substrate 102, the wire bonds 110, the first device 112, the shield 116, the void space 118, the sidewalls 120, the aperture(s) 124, the radiation energy 130, the collar shield 302, and the sidewall ends 402.

In this embodiment, the apertures 124 can be formed by processing the corners of the shield 116. By way of example, the size of the apertures 124 is determined by the distance between the sidewall ends 402 that are adjacent, and should not exceed one (1) millimeter. More specifically, the distance between the sidewall ends 402 can be down to fifty (50) microns to allow the encapsulation material 132 with a filler material to flow through the apertures 124. If just the encapsulation material 132 is used without a filler, the apertures 124 need only be large enough to allow flow of the encapsulation material 132.

Although the present embodiment depicts each corner of the shield 116 processed to form the apertures 124, it is to be understood that the invention includes processing any number of the corners of the shield 116 that does not adversely affect the requirements of the shield 116 for the integrated circuit package system 600.

The collar shield 302 is configured adjacent to the apertures 124. The collar shield 302 is designed to block or absorb the radiation energy 130 that passes through the apertures 124. By way of example, the collar shield 302 may be separately attached to the substrate 102 and may include materials similar to those used for the shield 116.

The height of the collar shield 302, as measured from the top surface of the substrate 102, is determined by its ability to absorb or block the radiation energy 130 while facilitating dispersion of the encapsulation material 132. Additionally, the placement of the collar shield 302 from the apertures 124 is also determined by its ability to absorb or block the radiation energy 130 while facilitating dispersion of the encapsulation material 132. The collar shield 302 is also electrically connected to a ground potential.

Figure 7:
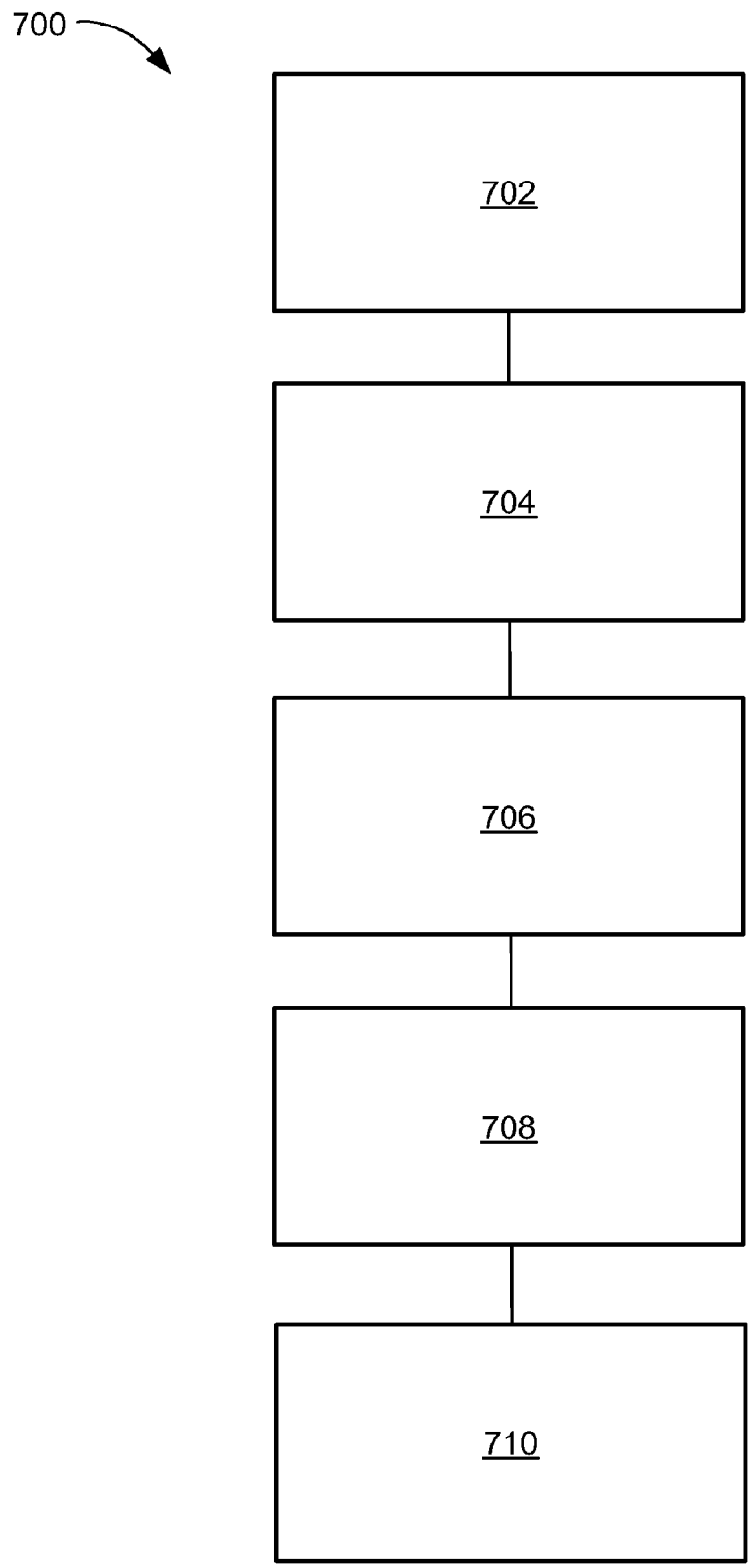
FIG. 7 is a flow chart for an integrated circuit package system for fabricating the integrated circuit package system in accordance with an embodiment of the present invention.

Referring now to FIG. 7, therein is shown a flow chart for an integrated circuit package system 700 for fabricating the integrated circuit package system 100, 200, 300, 400, 500 and 600 in accordance with an embodiment of the present invention. The integrated circuit package system 700 includes providing a substrate in a block 702; attaching a first device to the substrate in a block 704; attaching a shield to the substrate in a block 706; processing the shield to form apertures in a block 708; and configuring the shield to block electromagnetic radiation in a block 710.

It has been discovered that the present invention thus has numerous aspects. A principle aspect is that the present invention facilitates the dispersion of the encapsulation material over semiconductor devices that are shielded by an electromagnetic interference shield or a radio frequency interference shield. By forming apertures within the shield, the encapsulation material is allowed to flow freely through the shield and over the semiconductor devices contained within the shield.

Another aspect of the present invention is that the encapsulation material can improve device reliability by preventing the oxidation of bond pads located within a shield's protected environment.

Another aspect of the present invention is that the encapsulation material can improve device reliability by providing additional support to the shield by eliminating void space between the shield and the substrate. By way of example, the encapsulation material can prevent damage to the bond wires of the first device by absorbing and dissipating a compressive force that has been applied to the shield.

Yet another aspect of the present invention is that the shield blocks or absorbs electromagnetic energy that may pass through the apertures. By blocking and/or absorbing the electromagnetic energy that passes through the apertures, the shield prevents neighboring devices from being effected by this potentially disruptive energy force.

Yet still, another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional advantages. For instance, by facilitating the dispersion of an encapsulation material and by blocking the transmission of electromagnetic energy, the shield of the present invention produces a more reliable and less disruptive electronic device. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method of manufacture of an integrated circuit package system comprising:
providing a substrate;
attaching a first device to the substrate;
attaching a shield to the substrate;
processing the shield to form apertures;
configuring the shield to block electromagnetic energy that passes through the apertures; and
depositing an encapsulation material through the apertures.

2. The method as claimed in claim 1 wherein:
processing the shield to form the apertures facilitates dispersion of the encapsulation material.

3. The method as claimed in claim 1 wherein:
configuring the shield includes forming a projection to block electromagnetic energy.

4. The method as claimed in claim 1 wherein:
configuring the shield includes bending upwards flanges to block electromagnetic energy.

5. The method as claimed in claim 1 wherein:
configuring the shield includes forming a collar shield to block electromagnetic energy.

6. A method of manufacture of an integrated circuit package system comprising:
providing a substrate;
attaching a first device to the substrate;
forming a shield with a top and sidewalls from a continuous piece of material, the shield attached to the substrate;
forming apertures within the sidewalls;
configuring the shield to block electromagnetic energy that passes though the apertures by lengthening a projection; and
attaching a second device over the first device, the second device supported by the shield.

7. The method as claimed in claim 6 wherein:
forming the apertures within the sidewalls includes cutting the sidewalls.

8. The method as claimed in claim 6 wherein:
configuring the shield to block electromagnetic energy includes overlapping parts of the shield.

9. The method as claimed in claim 6 wherein:
attaching the first device includes attaching semiconductor chips and integrated circuit packages that transmit or receive electromagnetic energy.

10. The method as claimed in claim 6 wherein:
attaching the second device includes attaching semiconductor chips and integrated circuit packages that transmit or receive electromagnetic energy.

* * * * *